(12) United States Patent
Inagaki et al.

(10) Patent No.: US 11,313,627 B2
(45) Date of Patent: Apr. 26, 2022

(54) HEAT PIPE

(71) Applicant: FURUKAWA ELECTRIC CO., LTD., Tokyo (JP)

(72) Inventors: Yoshikatsu Inagaki, Tokyo (JP); Shinichi Ito, Tokyo (JP); Kazuya Takahashi, Tokyo (JP); Shuta Hikichi, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 200 days.

(21) Appl. No.: 16/723,690

(22) Filed: Dec. 20, 2019

(65) Prior Publication Data
US 2020/0141659 A1 May 7, 2020

Related U.S. Application Data

(63) Continuation of application No. PCT/JP2018/023768, filed on Jun. 22, 2018.

(30) Foreign Application Priority Data

Jun. 23, 2017 (JP) .............................. JP2017-122778

(51) Int. Cl.
- *F28D 15/04* (2006.01)
- *F28D 15/02* (2006.01)
- *H01L 23/427* (2006.01)

(52) U.S. Cl.
CPC ....... *F28D 15/046* (2013.01); *F28D 15/0233* (2013.01); *B23P 2700/09* (2013.01);
(Continued)

(58) Field of Classification Search
CPC .............. F28D 15/046; F28D 15/0233; F28D 15/0283; B23P 2700/09; F28F 2255/18; H01L 23/427; H01L 2924/0002
(Continued)

(56) References Cited

U.S. PATENT DOCUMENTS 6,508,302 B2 * 1/2003 Ishida .................... B21C 37/151
165/104.21
2007/0240858 A1 * 10/2007 Hou ....................... F28D 15/046
165/104.26
(Continued)

FOREIGN PATENT DOCUMENTS

CN 102449423 A 5/2012
CN 105423788 A 3/2016
(Continued)

OTHER PUBLICATIONS

English translation of International Preliminary Report on Patentability and English translation of the Written Opinion of the International Searching Authority (Forms POT/IB/338, PCT/IB/373 and PCT/ISA/237) for International Application No. PCT/JP2018/023768, dated Jan. 2, 2020.
(Continued)

*Primary Examiner* — Justin M Jonaitis
(74) *Attorney, Agent, or Firm* — Birch, Stewart, Kolasch & Birch, LLP

(57) ABSTRACT

The present disclosure provides a heat pipe capable of preventing deformation of even a thin container and having excellent heat transfer characteristics by preventing freezing of a working fluid even if the longitudinal direction of the container is set substantially parallel to the direction of gravity in cold regions. A heat pipe includes a container having a tubular shape with both ends sealed, a wick structure stored in the container, and a working fluid sealed in the container, wherein, in at least one of cross sections perpendicular to the longitudinal direction of the container, the wick structure is in contact with the inner surface of the container at two points but both side surfaces of the wick structure are not in contact with any inner surface of the container, and a sintered metal layer is formed on the
(Continued)

container inner surface being not in contact with the wick structure.

17 Claims, 6 Drawing Sheets

(52) U.S. Cl.
CPC ...... *F28D 15/0283* (2013.01); *F28F 2255/18* (2013.01); *H01L 23/427* (2013.01); *H01L 2924/0002* (2013.01)

(58) Field of Classification Search
USPC .................................................. 165/104.26
See application file for complete search history.

(56) References Cited

U.S. PATENT DOCUMENTS

| | | | |
|---|---|---|---|
| 2010/0266864 A1 | 10/2010 | Lee et al. | |
| 2011/0174464 A1* | 7/2011 | Liu ..................... | F28D 15/046 165/104.26 |
| 2011/0174465 A1* | 7/2011 | Liu ..................... | F28D 15/046 165/104.26 |
| 2012/0118537 A1 | 5/2012 | Kameoka et al. | |
| 2013/0037242 A1* | 2/2013 | Chen .................. | F28D 15/0233 165/104.26 |
| 2013/0105131 A1* | 5/2013 | Chen .................. | F28D 15/046 165/177 |
| 2013/0160976 A1* | 6/2013 | Wu .................... | F28D 15/0233 165/104.26 |
| 2013/0213612 A1* | 8/2013 | Wu .................... | F28D 15/046 165/104.26 |
| 2014/0166244 A1* | 6/2014 | Dai .................... | F28D 15/0233 165/104.26 |
| 2014/0166245 A1* | 6/2014 | Dai .................... | F28D 15/046 165/104.26 |
| 2015/0204617 A1* | 7/2015 | Thanhlong ........... | F28D 15/046 165/104.26 |
| 2016/0033206 A1 | 2/2016 | Kameoka et al. | |

FOREIGN PATENT DOCUMENTS

| | | |
|---|---|---|
| JP | 10-274487 A | 10/1998 |
| JP | 2011-043320 A | 3/2011 |
| TW | 201038896 A1 | 11/2010 |

OTHER PUBLICATIONS

Japanese Decision of Refusal for corresponding Japanese Application No. 2019-525701, dated Dec. 11, 2019, with an English translation.
Notice of Reasons for Refusal for corresponding Japanese Application No. 2019-525701, dated Oct. 27, 2020, with English translation.
International Search Report (PCT/ISA/210) issued in PCT/JP2018/023768, dated Sep. 11, 2018.
Notice of Allowance issued in Taiwanese Patent Application No. 107121530, dated Mar. 22, 2019.
Office Action issued in Japanese Patent Application No. 2019-525701, dated Jul. 29, 2019.
Office Action issued in Taiwanese Patent Application No. 107121530, dated Nov. 29, 2018.
Written Opinion (PCT/ISA/237) issued in PCT/JP2018/023768, dated Sep. 11, 2018.
First Notice of Reasons for Rejection dated Aug. 5, 2020 in corresponding Chinese Patent Application No. 201890000963.3, with English translation.
Reconsideration Report by Examiner before Appeal dated May 12, 2020 in corresponding Japanese Application No. 2019-525701 (with English Machine translation).

* cited by examiner

HEAT PIPE

CROSS REFERENCE TO RELATED APPLICATIONS

The present application is a continuation application of International Patent Application No. PCT/JP2018/023768 filed on Jun. 22, 2018, which claims the benefit of Japanese Patent Application No. 2017-122778, filed on Jun. 23, 2017. The contents of these applications are incorporated herein by reference in their entirety.

BACKGROUND

Technical Field

The present disclosure relates to a thin heat pipe having a good maximum heat transfer rate and further having a small thermal resistance and excellent heat transfer characteristics.

Background

The amount of heat generated by electronic components, such as semiconductor devices mounted in electric and electronic equipment, is on the increase due to high density mounting associated with higher functions, and cooling the electronic components is becoming more important. As a method of cooling the electronic components, a heat pipe may be used.

Moreover, as the installation space for the heat pipe becomes narrower due to high density mounting of the electronic components, thinning of the electronic components and the like, the use of a flat heat pipe may be required. For thinning, a flat heat pipe may reduce the thickness of a container.

On the other hand, heat pipes may be used in cold regions. When a heat pipe is installed in a cold region, a working fluid sealed in a container may freeze, and the heat pipe may not work smoothly. Therefore, a heat-pipe type cooler in which the amount of the working fluid in at least one of a plurality of heat pipes is 35% to 65% of the amount of the working fluid in the other heat pipes was proposed to reduce the time required for activation when the working fluid freezes by first melting the working fluid in the heat pipe having the smaller amount of working fluid and a smaller heat capacity (Japanese Patent Application Laid-Open No. H10-274487).

However, according to Japanese Patent Application Laid-Open No. H10-274487, the working fluid still easily freezes in cold regions, and when the working fluid freezes, the volume expands and may cause deformation or breakage of the thin container. Moreover, if the container is deformed, another problem arises as the container may hit and damage other members such as a liquid crystal and a battery disposed around the heat pipe. Furthermore, in a flat heat pipe using a thin container, since the clearance inside the container is narrow, volumetric expansion due to freezing of working fluid may cause more conspicuous deformation or breakage of the container, and, if the longitudinal direction of the flat heat pipe is set substantially parallel to the direction of gravity, the working fluid in the liquid phase tends to accumulate in the bottom portion of the container, and may also cause more conspicuous deformation or breakage of the container by volumetric expansion due to freezing of the working fluid.

On the other hand, using antifreeze to prevent freezing of the working fluid, or increasing the thickness of the container to prevent deformation and breakage of the container due to freezing of the working fluid, may cause the heat transfer characteristics of the heat pipe to deteriorate.

SUMMARY

The present disclosure is related to providing a heat pipe capable of preventing deformation of even a thin container and having excellent heat transfer characteristics by preventing freezing of the working fluid even if the longitudinal direction of the container is set substantially parallel to the direction of gravity in a cold region.

According to an aspect of the present disclosure, a heat pipe includes: a container having a tubular shape with both ends sealed; a wick structure stored in the container; and a working fluid sealed in the container, wherein, in at least one of cross sections perpendicular to a longitudinal direction of the container, the wick structure is in contact with an inner surface of the container at two points, but both side surfaces of the wick structure are not in contact with any inner surface of the container, and a sintered metal layer is formed on the container inner surface being not in contact with the wick structure.

In the heat pipe according to an aspect of the present disclosure, at least a part of the cross sections perpendicular to the longitudinal direction of the container is flattened.

In the heat pipe according to an aspect of the present disclosure, in the cross section which is flattened at least in part, the wick structure has a flat bottom side portion and a protruding upper side portion in a protruding shape, the protruding upper side portion is in contact with one of inner surfaces facing each other, and the bottom side portion is in contact with another of the inner surfaces.

According to an aspect of the present disclosure, a heat pipe includes: a flat container having a tubular shape with both ends sealed, and a pair of inner surfaces facing each other in a vertical direction in a cross section perpendicular to a longitudinal direction; a wick structure stored in the flat container; and a working fluid sealed in the flat container, wherein, in at least one of cross sections perpendicular to the longitudinal direction of the flat container, the wick structure is in contact with both of the pair of inner surfaces of the flat container, but both side surfaces of the wick structure are not in contact with any inner surface of the flat container, and a sintered metal layer is formed on the flat container inner surface being not in contact with the wick structure.

In the above aspect, the inner surfaces of the flat container have a portion being in contact with the wick structure, and a portion where the sintered metal layer is formed.

In the heat pipe according to an aspect of the present disclosure, in at least the one cross section, a cross section of the wick structure has a flat bottom side portion and a protruding upper side portion in a protruding shape, the protruding upper side portion is in contact with one of the pair of inner surfaces facing each other, and the bottom side portion is in contact with another of the inner surfaces.

In the heat pipe according to an aspect of the present disclosure, a value of thickness of the sintered metal layer/thickness of the container is between 30% and 130%, and a value of (cross sectional area of contact areas of the wick structure being in contact with the container and corresponding to thickness of the sintered metal layer+cross sectional area of the sintered metal layer)/(cross sectional area of the wick structure+cross sectional area of the sintered metal layer) is between 45% and 95%.

In the heat pipe according to an aspect of the present disclosure, the wick structure is a sintered metal body.

According to an aspect of the present disclosure, a heat pipe includes: a container having a tubular shape with both ends sealed; a wick structure stored in the container; and a working fluid sealed in the container, wherein the wick structure is composed of a first wick structure portion and a second wick structure portion disposed in a vertical direction in at least one of cross sections perpendicular to a longitudinal direction of the container, the first wick structure portion is in contact with an inner surface of the container at one point, but both side surfaces of the first wick structure portion are not in contact with any inner surface of the container, the second wick structure portion is in contact with the inner surface of the container at another point, but both side surfaces of the second wick structure portion are not in contact with any inner surface of the container, and a sintered metal layer is formed on the container inner surface being not in contact with the wick structure.

In the heat pipe according to an aspect of the present disclosure, the first wick structure portion is in contact with the second wick structure portion.

In the heat pipe according to an aspect of the present disclosure, at least a part of the cross sections perpendicular to the longitudinal direction of the container is flattened.

In the heat pipe according to an aspect of the present disclosure, in the cross section which is flattened at least in part, the first wick structure portion has a protruding bottom side portion in a protruding shape and an upper side portion, the second wick structure portion has a flat bottom side portion and a protruding upper side portion in a protruding shape, the protruding bottom side portion of the first wick structure portion is in contact with the protruding upper side portion of the second wick structure portion, the upper side portion of the first wick structure portion is in contact with one of inner surfaces facing each other, and the flat bottom side portion of the second wick structure portion is in contact with another of the inner surfaces.

According to an aspect of the present disclosure, a heat pipe includes: a flat container having a tubular shape with both ends sealed, and a pair of inner surfaces facing each other in a vertical direction in a cross section perpendicular to a longitudinal direction; a wick structure stored in the flat container; and a working fluid sealed in the flat container, wherein the wick structure is composed of a first wick structure portion and a second wick structure portion disposed in the vertical direction in at least one of cross sections perpendicular to the longitudinal direction of the flat container, the first wick structure portion is in contact with one of the pair of inner surfaces of the flat container and with the second wick structure portion, but both side surfaces of the first wick structure portion are not in contact with any inner surface of the flat container, the second wick structure portion is in contact with another inner surface of the pair of inner surfaces of the flat container, but both side surfaces of the second wick structure portion are not in contact with any inner surface of the flat container, and a sintered metal layer is formed on the flat container inner surface being not in contact with the wick structure.

In the above aspect, the inner surfaces of the flat container have portions being in contact with the first wick structure portion or the second wick structure portion, and a portion where the sintered metal layer is formed.

In the heat pipe according to an aspect of the present disclosure, in at least the one cross section, a cross section of the first wick structure portion has a protruding bottom side portion in a protruding shape and a flat upper side portion, a cross section of the second wick structure portion has a flat bottom side portion and a protruding upper side portion in a protruding shape, the protruding bottom side portion of the first wick structure portion is in contact with the protruding upper side portion of the second wick structure portion, the flat upper side portion of the first wick structure portion is in contact with the one inner surface, and the flat bottom side portion of the second wick structure portion is in contact with the another inner surface.

In the heat pipe according to an aspect of the present disclosure, a value of thickness of the sintered metal layer/thickness of the container is between 30% and 130%, and a value of (cross sectional area of contact areas of the wick structure being in contact with the container and corresponding to thickness of the sintered metal layer+cross-sectional area of the sintered metal layer)/(cross-sectional area of the wick structure+cross-sectional area of the sintered metal layer) is between 45% and 95%.

In the heat pipe according to an aspect of the present disclosure, the wick structure is a sintered metal body.

According to the aspects of the present disclosure, since the sintered metal layer is formed on the container inner surface being not in contact with the wick structure, the working fluid in the liquid phase is dispersed by the sintered metal layer, and therefore, even if the longitudinal direction of the container is set substantially parallel to the direction of gravity in a cold region, it is possible to prevent freezing of the working fluid. Thus, even if the longitudinal direction of the container is set substantially parallel to the direction of gravity in a cold region, since freezing of the working fluid is prevented, it is possible to prevent deformation of even a thin container having a thin thickness. Moreover, it is not necessary to use antifreeze and it is possible to use a container with a thin thickness, and thus excellent heat transfer characteristics can be exhibited. Furthermore, even if the longitudinal direction of the container is set substantially parallel to the direction of gravity, freezing of the working fluid can be prevented, and therefore the degree of freedom in the installation posture of the heat pipe is improved.

DETAILED DESCRIPTION

Hereinafter, a heat pipe according to the first embodiment of the present disclosure will be described using the drawings.

Figure 1:
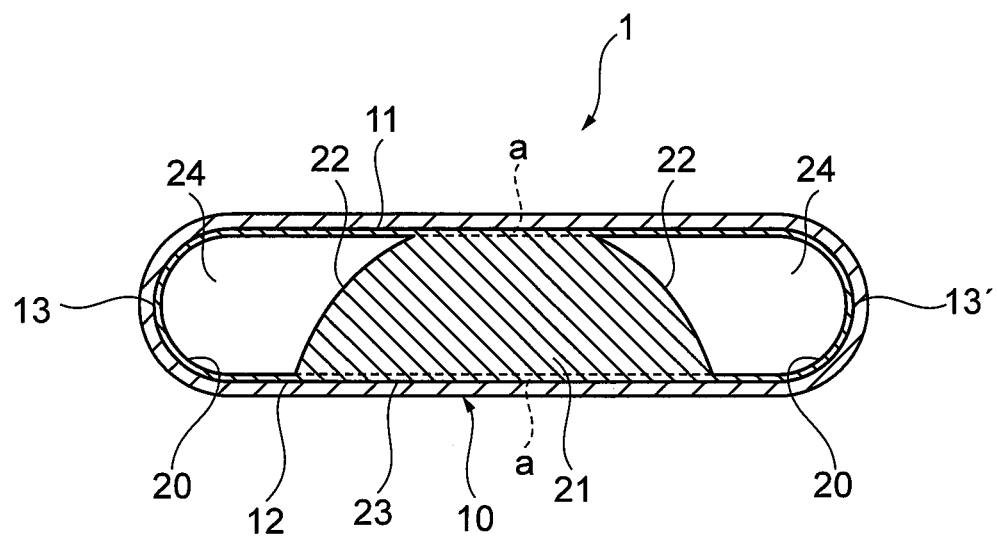
FIG. 1 is a sectional view of a heat pipe according to a first embodiment of the present disclosure.

As shown in FIG. 1, a heat pipe 1 according to the first embodiment includes: a flat container 10 of a tubular shape having one flat inner surface 11, and another flat inner surface 12 facing the one flat inner surface 11; a wick structure 21 disposed on the another flat inner surface 12; and a working fluid (not shown) sealed in the flat container 10.

The flat container 10 is a sealed straight tubular material having one flat inner surface 11, another flat inner surface 12 facing the one flat inner surface 11, and curved surface portions 13 and 13' formed between the one flat inner surface 11 and another flat inner surface 12, and the shape of a cross section in a direction orthogonal to a longitudinal direction (that is, perpendicular to the longitudinal direction) is flat. That is, the flat container 10 has a pair of flat inner surfaces facing each other in a vertical direction in a cross section perpendicular to the longitudinal direction. The flat container 10 is flat entirely throughout the longitudinal direction. Further, at any portion of the flat container 10, the cross-sectional area of the internal space in the direction orthogonal to the longitudinal direction is equal, and the one flat inner surface 11 is formed in a direction substantially parallel to the another flat inner surface 12. Furthermore, although the distance between the one flat inner surface 11 and another flat inner surface 12 is not particularly limited, the flat container 10 is thin, no more than 1.5 mm and particularly no more than 1.0 mm. The thickness of the flat container 10 is not particularly limited but is, for example, between 50 μm and 500 μm. The heat transfer direction of the heat pipe 1 is the longitudinal direction of the flat container 10. In the heat pipe 1, the distance between the one flat inner surface 11 and another flat inner surface 12 is substantially equal over the entire longitudinal direction of the flat container 10.

The wick structure 21 has a curved portion 22, which is a protruding upper side portion in a protruding shape projecting from the another flat inner surface 12, and a flat bottom side portion 23. The flat bottom side portion 23 is in contact with a partial area of the another flat inner surfaces 12. In the heat pipe 1, the bottom side portion 23 is fixed to the another flat inner surface 12. The wick structure 21 is placed at a substantially central portion in a direction orthogonal to the longitudinal direction of the flat container 10 (in the cross section of the flat container 10). In the heat pipe 1, the cross-sectional shape of the wick structure 21 in the direction orthogonal to the longitudinal direction of the flat container 10 is substantially semi-elliptical.

In the heat pipe 1, a sintered metal layer 20 is formed on each of an area in the another flat inner surface 12 of the flat container 10, which is not in contact with the bottom side portion 23 of the wick structure 21, and an area in the one flat inner surface 11 of the flat container 10, which is not in contact with the curved portion 22 of the wick structure 21, and on the curved surface portions 13 and 13' of the flat container 10. That is, in the inner surfaces of the flat container 10, the areas which are not in contact with the wick structure 21 are covered with the sintered metal layer 20. An inner surface (the surface) of the sintered metal layer 20 is exposed to the internal space of the flat container 10.

The wick structure 21 has the curved portion 22 in contact with the one flat inner surface 11 of the flat container 10. In the heat pipe 1, the top of the curved portion 22 is in contact with the one flat inner surface 11. Moreover, the top of the curved portion 22 is pressure welded to the one flat inner surface 11. Thus, the top of the curved portion 22 is in a state of being compressed and squashed. Consequently, the capillary pressure of the wick structure 21 is further improved, and the working fluid in the liquid phase can be more smoothly returned.

The wick structure 21 extends from one end portion to another end portion of the flat container 10. The maximum width of the wick structure 21 in the direction orthogonal to the longitudinal direction of the flat container 10 is not particularly limited at any of the one end portion, central portion and another end portion of the flat container 10, but, in the heat pipe 1, the maximum width is substantially equal from the one end portion to another end portion.

The sintered metal layer 20 extends from the one end portion to another end portion of the flat container 10. Thus, the sintered metal layer 20 is formed entirely in the longitudinal direction of the flat container 10. The thickness of the sintered metal layer 20 is not particularly limited, but is, for example, 0.30 mm or less. The ratio of the thickness of the sintered metal layer 20/the thickness of the flat container 10 in the cross section of the flat container 10 is not particularly limited, but is preferably 30% or more, more preferably 40% or more, and particularly preferably 60% or more from the viewpoint of reliably preventing accumulation of the working fluid in the liquid phase. On the other hand, the upper limit value of the above ratio is not particularly limited, but is preferably 130% or less from the viewpoint of the circulation of the working fluid in the gas phase. Further, in the above-mentioned cross section, the ratio of (the cross-sectional area of contact areas of the wick structure 21 (the areas indicated with "a" in FIG. 1) being in contact with the flat container 10 and corresponding to thickness of the sintered metal layer 20+the cross sectional area of the sintered metal layer 20)/(the cross-sectional area of the wick structure 21+the cross-sectional area of the sintered metal layer 20) is not particularly limited, but is preferably 45% or more, more preferably 60% or more, and particularly preferably 70% or more from the viewpoint of reliably preventing accumulation of the working fluid in the liquid phase. On the other hand, the upper limit value of the ratio is not particularly limited, but is preferably 95% or less from the viewpoint of the circulation of the working fluid in the gas phase.

Thin grooves in the form of recesses and protrusions may be formed on the inner surface of the flat container 10 of the heat pipe 1. In the case where thin grooves in the form of recesses and protrusions are formed on the inner surface of the flat container 10, the thickness of the flat container 10 is the thickness at the bottom portion of the thin groove (the bottom portion of the recess), and the thickness of the sintered metal layer 20 is the thickness at the bottom portion of the thin groove (the bottom portion of the recess).

As shown in FIG. 1, in the internal space of the flat container 10, a portion where the wick structure 21 is not positioned is a vapor flow path 24 of the working fluid in the gas phase. That is, the vapor flow path 24 is formed of an area of the one flat inner surface 11 which is not in contact with the wick structure 21 (that is, the surface of the sintered metal layer 20 on the one flat inner surface 11), the surface of the curved portion 22 of the wick structure 21, an area of the another flat inner surface 12 which is not in contact with the wick structure 21 (that is, the surface of the sintered metal layer 20 on the another flat inner surface 12), and the curved surface portion 13 or 13' of the flat container 10 (that is, the surface of the sintered metal layer 20 on the curved surface portion 13 or 13'). Thus, the vapor flow path 24 extends in a direction parallel to the longitudinal direction of the flat container 10. The vapor flow path 24 is provided on both sides of the wick structure 21.

The material of the flat container 10 is not particularly limited, and, for example, it is possible to use copper and copper alloys from the viewpoint of excellent thermal conductivity, aluminum and aluminum alloys from the viewpoint of lightness, stainless steel and the like from the viewpoint of improvement in strength. Moreover, tin, tin alloys, titanium, titanium alloys, nickel and nickel alloys and the like may be used depending on the conditions of use. The material of the wick structure 21 is not particularly limited, and it is possible to use a sintered body of metal powder such as copper powder and stainless steel powder, carbon powder, mixed powder of copper powder and carbon powder, nanoparticles of the above powders, composite metal of a combination of metal mesh and metal powder, etc. The sintered body can be produced by sintering the above powder or composite metal to join the powders, and a porous structure having capillary pressure is formed by sintering. The material of the sintered metal layer 20 is not particularly limited as long as a sintered body of powder including metal powder, and it is possible to use a sintered body of, for example, metal powder such as copper powder and stainless steel powder, mixed powder of copper powder and carbon powder, and nanoparticles of the above powders.

In accordance with the compatibility with the material of the flat container 10, a working fluid to be sealed in the flat container 10 can be appropriately selected, for example, from water, alternative chlorofluorocarbon, perfluorocarbon, cyclopentane, and so on.

Next, the heat transfer mechanism of the heat pipe 1 according to the first embodiment of the present disclosure will be described. When the heat pipe 1 receives heat from a heat generating device (not shown) thermally connected in a heat receiving portion, the working fluid undergoes a phase change from the liquid phase to the gas phase in the heat receiving portion. The working fluid in the gas phase flows through the vapor flow paths 24 in the longitudinal direction of the flat container 10 from the heat receiving portion to a heat releasing portion, whereby the heat from the heat generating device is transferred from the heat receiving portion to the heat releasing portion. The heat from the heat generating device, which has been transferred from the heat receiving portion to the heat releasing portion, is released as latent heat by a phase change of the working fluid in the gas phase to the liquid phase in the heat releasing portion where a heat exchange means is provided. The latent heat released in the heat releasing portion is released to outside environment of the heat pipe 1 from the heat releasing portion by the heat exchange means (not shown) provided in the heat releasing portion. The working fluid that has undergone a phase change to the liquid phase in the heat releasing portion is taken into the wick structure 21, and is returned to the heat receiving portion from the heat releasing portion by the capillary pressure of the wick structure 21.

In the heat pipe 1 according to the first embodiment, since the sintered metal layer 20 is formed on the inner surfaces of the flat container 10 which are not in contact with the wick structure 21, the working fluid in the liquid phase is dispersed by capillary forces of the compact layer 20, that is, accumulation of the working fluid in the liquid phase is prevented by the sintered metal layer 20. Therefore, even if the longitudinal direction of the container is set substantially parallel to the direction of gravity in a cold region, it is possible to prevent freezing of the working fluid in the liquid phase. Thus, even if the longitudinal direction of the container is set substantially parallel to the direction of gravity in a cold region, since the working fluid in the liquid phase is prevented from freezing, it is possible to prevent deformation and breakage of even the thin-type flat container 10 having a thin thickness. Further, in the heat pipe 1 according to the first embodiment, it is not necessary to use antifreeze as the working fluid and it is possible to use the flat container 10 having a thin thickness, and thus excellent heat transfer characteristics can be exhibited. Furthermore, even if the flat container 10 is installed so that the longitudinal direction is substantially parallel to the direction of gravity, freezing of the working fluid can be prevented, and therefore the degree of freedom in the installation posture of the heat pipe 1 is improved.

Next, a heat pipe according to the second embodiment of the present disclosure will be described using the drawings. The same components as those of the heat pipe according to the first embodiment will be described using the same reference signs.

Figure 2:
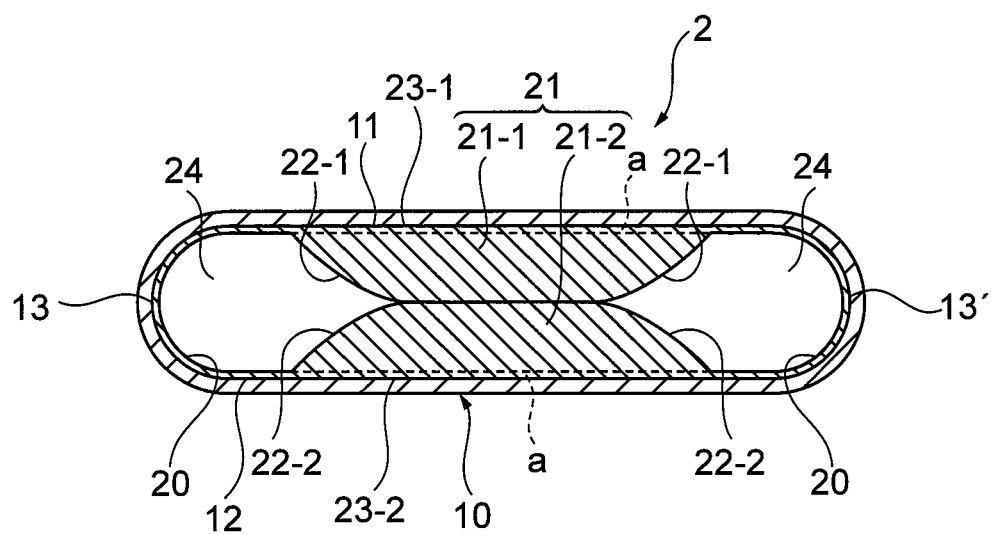
FIG. 2 is a sectional view of a heat pipe according to a second embodiment of the present disclosure.

In the heat pipe according to the first embodiment, the wick structure 21 has a curved portion and a bottom portion, and the curved portion is in contact with one flat inner surface of the flat container and the bottom portion is in contact with another flat inner surface. Alternatively, as shown in FIG. 2, in a heat pipe 2 according to the second embodiment, the wick structure 21 has a first wick structure portion 21-1 disposed on the one flat inner surface 11, and a second wick structure portion 21-2 disposed on the another flat inner surface 12.

The first wick structure portion 21-1 has a first curved portion 22-1 which is a protruding bottom side portion in a protruding shape projecting from one flat inner surface 11, and a flat upper side portion 23-1. The flat upper side portion 23-1 is in contact with a partial area of the one flat inner surface 11. In the heat pipe 2, the flat upper side portion 23-1 is fixed to the one flat inner surface 11. The first wick structure portion 21-1 is placed at a substantially central portion in a direction orthogonal to the longitudinal direction of the flat container 10 (in the cross section of the flat container 10). In the heat pipe 2, the cross-sectional shape of the first wick structure portion 21-1 in the direction orthogonal to the longitudinal direction of the flat container 10 is substantially semi-elliptical.

The second wick structure portion 21-2 has a second curved portion 22-2, which is a protruding upper side portion in a protruding shape projecting from the another flat inner surface 12 and facing the first curved portion 22-1 which is a protruding bottom side portion in a protruding shape, and a flat bottom side portion 23-2. The flat bottom side portion 23-2 is in contact with a partial area of the another flat inner surface 12. In the heat pipe 2, the flat bottom side portion 23-2 is fixed to the another flat inner surface 12. The second wick structure portion 21-2 is placed at the substantially central portion in the direction orthogonal to the longitudinal direction of the flat container 10. In the heat pipe 2, the cross-sectional shape of the second wick structure portion 21-2 in the direction orthogonal to the longitudinal direction of the flat container 10 is substantially semi-elliptical.

In the heat pipe 2, the sintered metal layer 20 is formed on each of an area in the flat inner surface 11 of the flat container 10, which is not in contact with the flat upper side portion 23-1 of the first wick structure portion 21-1, and an area in the another flat inner surface 12 of the flat container 10, which is not in contact with the flat bottom side portion 23-2 of the second wick structure portion 21-2, and on the curved surface portions 13 and 13' of the flat container 10. That is, in the inner surfaces of the flat container 10, the areas which are not in contact with the wick structure 21 are covered with the sintered metal layer 20. An inner surface (the surface) of the sintered metal layer 20 is exposed to the internal space of the flat container 10.

In the first wick structure portion 21-1, the first curved portion 22-1 is in contact with the second curved portion 22-2 of the second wick structure portion 21-2. In the heat pipe 2, the bottom of the first curved portion 22-1 and the top of the second curved portion 22-2 are in contact with each other. Further, both of the bottom of the first curved portion 22-1 and the top of the second curved portion 22-2 are pressure welded. Thus, the bottom of the first curved portion 22-1 and the top of the second curved portion 22-2 are in a state of being compressed and squashed. Consequently, the capillary pressure of the first wick structure portion 21-1 and the second wick structure portion 21-2 is further improved, and the working fluid in the liquid phase can be more smoothly returned.

The ratio of the thickness of the sintered metal layer 20/the thickness of the flat container 10 in the cross section of the flat container 10 is not particularly limited, but is preferably 30% or more, more preferably 40% or more, and particularly preferably 60% or more from the viewpoint of reliably preventing accumulation of the working fluid in the liquid phase. On the other hand, the upper limit value of the above ratio is not particularly limited, but is preferably 130% or less from the viewpoint of the circulation of the working fluid in the gas phase. Further, in the above-mentioned cross section, the ratio of (the cross sectional area of contact areas of the wick structure 21 (the areas indicated with "a" in FIG. 2) being in contact with the flat container 10 and corresponding to thickness of the sintered metal layer 20+the cross sectional area of the sintered metal layer 20)/(the cross-sectional area of the wick structure 21+the cross-sectional area of the sintered metal layer 20) is not particularly limited, but is preferably 45% or more, more preferably 60% or more, and particularly preferably 70% or more from the viewpoint of reliably preventing accumulation of the working fluid in the liquid phase. On the other hand, the upper limit value of the ratio is not particularly limited, but is preferably 95% or less from the viewpoint of the circulation of the working fluid in the gas phase.

Thin grooves in the form of recesses and protrusions may be formed on the inner surface of the flat container 10 of the heat pipe 2. In the case where the thin grooves in the form of recesses and protrusions are formed on the inner surface of the flat container 10, the thickness of the flat container 10 is the thickness at the bottom portion of the thin groove (the bottom portion of the recess), and the thickness of the sintered metal layer 20 is the thickness at the bottom portion of the thin groove (the bottom portion of the recess).

Also, in the heat pipe 2 according to the second embodiment, the sintered metal layer 20 is formed on the inner surfaces of the flat container 10, which are not in contact with the wick structure 21, and therefore the working fluid in the liquid phase is dispersed by capillary forces of the sintered metal layer 20, that is, accumulation of the working fluid in the liquid phase is prevented by the sintered metal layer 20, thereby preventing freezing of the working fluid in the liquid phase even in cold regions.

Next, a heat pipe according to the third embodiment of the present disclosure will be described using the drawings. The same components as those of the heat pipes according to the first and second embodiments will be described using the same reference signs.

Figure 3:
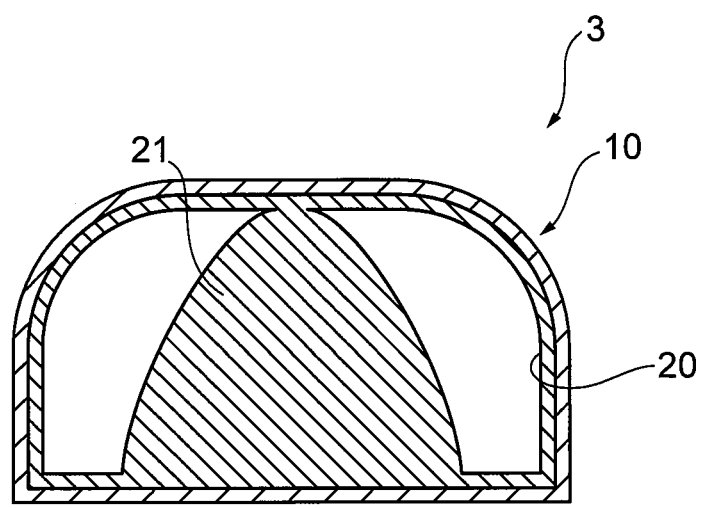
FIG. 3 is a sectional view of a heat pipe according to a third embodiment of the present disclosure.

The cross-sectional shape of the container of the heat pipe according to the first embodiment is of a flat type having one flat inner surface and another flat inner surface facing each other. Alternatively, as shown in FIG. 3, in a heat pipe 3 according to the third embodiment, the cross-sectional shape of the container 10 is a flat shape composed of a flat portion and a semi-elliptical portion.

That is, in the heat pipe 3, only a partial area in the cross section perpendicular to the longitudinal direction of the container 10 is flattened. In the cross section, the flattened area forms another flat inner surface, and the non-flat area is one inner surface having a substantially semi-elliptical shape and facing the another flat inner surface.

The wick structure 21 has a curved portion that is a protruding upper side portion in a protruding shape projecting from the flattened another flat inner surface, and a flat bottom side portion. The flat bottom side portion is in contact with a partial area of the flattened another flat inner surface. Also in the heat pipe 3, the flat bottom side portion is fixed to the another flat inner surface. The wick structure 21 is placed at a substantially central portion in a direction orthogonal to the longitudinal direction of the container 10 (in the cross section of the container 10). Also in the heat pipe 3, the cross-sectional shape of the wick structure 21 in the direction orthogonal to the longitudinal direction of the container 10 is substantially semi-elliptical.

Moreover, the curved portion of the wick structure 21 is in contact with the substantially semielliptical shaped one inner surface of the container 10. In the heat pipe 3, the top of the curved portion is also in contact with the one inner surface.

Also in the heat pipe 3, the sintered metal layer 20 is formed on each of an area in the another flat inner surface of the container 10, which is not in contact with the flat bottom side portion of the wick structure 21, and an area in the substantially semielliptical one inner surface, which is not in contact with the curved portion of the wick structure 21. That is, in the inner surfaces of the container 10, the areas which are not in contact with the wick structure 21 are covered with the sintered metal layer 20. An inner surface (the surface) of the sintered metal layer 20 is exposed to the internal space of the container 10.

Also, in the heat pipe 3 according to the third embodiment, since the sintered metal layer 20 is formed on the inner surfaces of the container 10 which are not in contact with the wick structure 21, the working fluid in the liquid phase is dispersed by capillary forces of the sintered metal layer 20, thereby preventing freezing of the working fluid in the liquid phase even in cold regions.

Next, a heat pipe according to the fourth embodiment of the present disclosure will be described using the drawings. The same components as those of the heat pipes according to the first to third embodiments will be described using the same reference signs.

Figure 4:
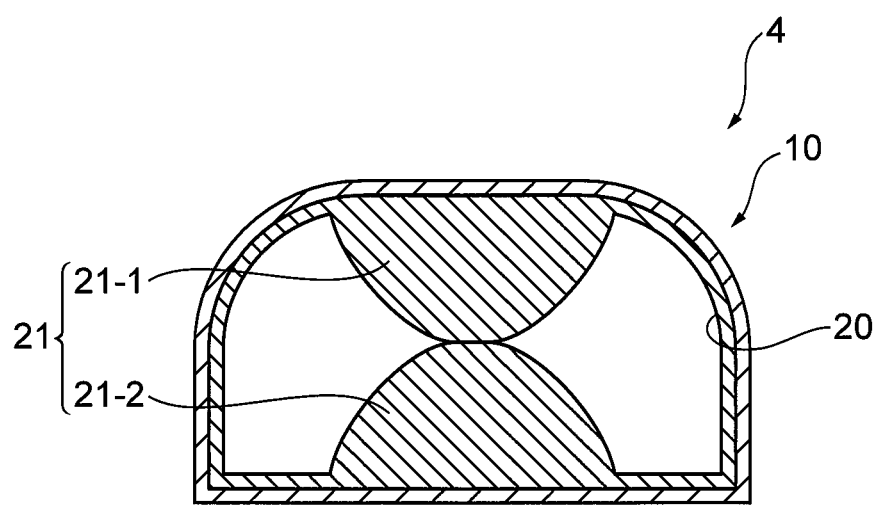
FIG. 4 is a sectional view of a heat pipe according to a fourth embodiment of the present disclosure.

The cross-sectional shape of the container of the heat pipe according to the second embodiment is of a flat type having one flat inner surface and another flat inner surface facing each other. Alternatively, as shown in FIG. 4, in a heat pipe 4 according to the fourth embodiment, the cross-sectional shape of the container 10 is a flat shape composed of a flat portion and a semi-elliptical portion.

That is, in the heat pipe 4, only a partial area of a cross section perpendicular to the longitudinal direction of the container 10 is flattened. In the cross section, the flattened area forms another flat inner surface, and the non-flat area is one inner surface having a substantially semi-elliptical shape and facing the another flat inner surface.

The first wick structure portion 21-1 has a first curved portion that is a protruding bottom side portion in a protruding shape projecting from the substantially semi-elliptical shaped one inner surface 11, and an upper side portion. The upper side portion is in contact with a partial area of the substantially semi-elliptical shaped one inner surface 11. Also in the heat pipe 4, the upper side portion is fixed to the one inner surface. The first wick structure portion 21-1 is placed at a substantially central portion in a direction orthogonal to the longitudinal direction of the container 10 (in the cross section of the container 10).

The second wick structure portion 21-2 has a second curved portion, which is a protruding upper side portion in a protruding shape projecting from the another flat inner surface which has been flattened and faces the first curved portion that is the protruding bottom side portion in a protruding shape, and a flat bottom side portion. The flat bottom portion is in contact with a partial area of the another flat inner surface. Also in the heat pipe 4, the flat bottom side portion is fixed to the another flat inner surface. The second wick structure portion 21-2 is placed at a substantially central portion in the direction orthogonal to the longitudinal direction of the container 10. In the heat pipe 4, the cross-sectional shape of the second wick structure portion 21-2 in the direction orthogonal to the longitudinal direction of the container 10 is also substantially semi-elliptical.

The first curved portion of the first wick structure portion 21-1 is in contact with the second curved portion of the second wick structure portion. Also in the heat pipe 4, the bottom of the first curved portion and the top of the second curved portion are in contact with each other.

In the heat pipe 4, the sintered metal layer 20 is also formed on each of an area in the substantially semi-elliptical one inner surface of the container 10, which is not in contact with the upper side portion of the first wick structure portion 21-1, and an area in the another flat inner surface of the container 10, which is not in contact with the flat bottom side portion of the second wick structure portion 21-2. That is, in the inner surfaces of the container 10, the areas which are not in contact with the wick structure 21 are covered with the sintered metal layer 20. An inner surface (the surface) of the sintered metal layer 20 is exposed to the internal space of the container 10.

Also, in the heat pipe 4 according to the fourth embodiment, since the sintered metal layer 20 is formed on the inner surfaces of the container 10 which are not in contact with the wick structure 21, the working fluid in the liquid phase is dispersed by capillary forces of the sintered metal layer 20, thereby preventing freezing of the working fluid in the liquid phase even in cold regions.

Next, a heat pipe according to the fifth embodiment of the present disclosure will be described using the drawings. The same components as those of the heat pipes according to the first to fourth embodiments will be described using the same reference signs.

Figure 5:
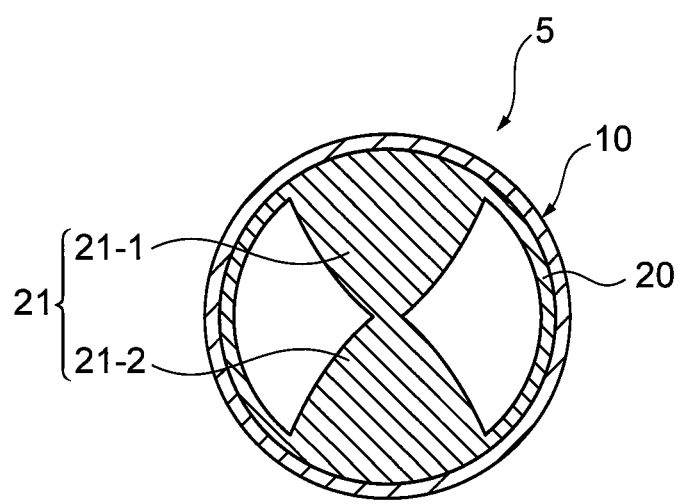
FIG. 5 is a sectional view of a heat pipe according to a fifth embodiment of the present disclosure.

The cross-sectional shape of the container of the heat pipe according to the second embodiment is of a flat type. Alternatively, as shown in FIG. 5, in a heat pipe 5 according to the fifth embodiment, the cross sectional shape of the container 10 is circular. That is, unlike the container of the heat pipes according to the first to fourth embodiments, the container 10 of the heat pipe 5 has a shape which has not been flattened. Also in the heat pipe 5 according to the fifth embodiment, similarly to the heat pipes of the first to fourth embodiments, since the sintered metal layer 20 is formed on the inner surface of the container 10, which is not in contact with the wick structure 21, the working fluid in the liquid phase is dispersed by capillary forces of the sintered metal layer 20, thereby preventing freezing of the working fluid in the liquid phase even in cold regions.

Next, a heat pipe according to the sixth embodiment of the present disclosure will be described using the drawings. The same components as those of the heat pipes according to the first to fifth embodiments will be described using the same reference signs.

Figure 6:
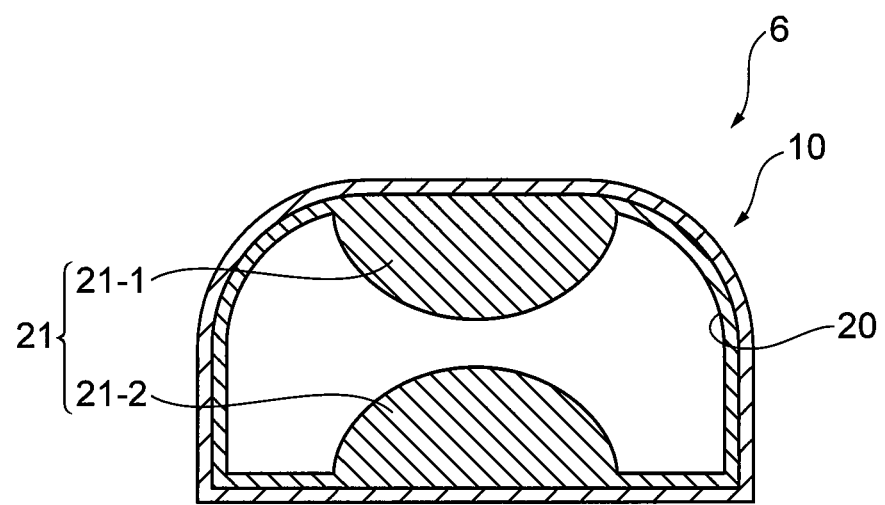
FIG. 6 is a sectional view of a heat pipe according to a sixth embodiment of the present disclosure.

In the heat pipe according to the fourth embodiment in which the cross-sectional shape of the container is a flat shape composed of the flat portion and the semi-elliptical portion, the first wick structure portion 21-1 is in contact with the second wick structure portion 21-2. Alternatively, in a heat pipe 6 according to the sixth embodiment, as shown in FIG. 6, the first wick structure portion 21-1 is not in contact with the second wick structure portion 21-2.

In the heat pipe 6, in the first wick structure portion 21-1, the first curved portion that is the protruding bottom side portion in a protruding shape is not in contact with the second curved portion that is the protruding upper side portion in a protruding shape of the second wick structure portion.

Also, in the heat pipe 6 according to the sixth embodiment, since the sintered metal layer 20 is formed on the inner surfaces of the container 10, which are not in contact with the wick structure 21, the working fluid in the liquid phase is dispersed by capillary forces of the sintered metal layer 20, thereby preventing freezing of the working fluid in the liquid phase even in cold regions.

Next, an example of a manufacturing method of a heat pipe of the present disclosure will be described. Here, a manufacturing method of a heat pipe according to the first embodiment will be described as an example. The manufacturing method is not specifically limited, but, for example, in the heat pipe according to the first embodiment, a core rod having a recessed portion of a predetermined shape is inserted along a longitudinal direction of a circular tubular material. A cavity portion formed between the inner surface of the tubular material and the outer surface of the recessed portion is filled with a material (for example, a powdered metal material) to be a wick structure. Further, a gap between the inner surface of the tubular material and the outer surface of the core rod is filled with a material (for example, a powdered metal material) to be a sintered metal layer. Next, heating is performed to form precursors of the wick structure and the sintered metal layer. Thereafter, the core rod is pulled out of the tubular material, and the tubular material is flattened, whereby the heat pipe having the wick structure and the sintered metal layer is manufactured.

Next, a heat pipe according to other embodiment of the present disclosure will be described. In the heat pipes according to the first and second embodiments, the flat container is flat over the entire longitudinal direction, but, alternatively, the container may be partly flat in the longitudinal direction. Moreover, the wick structure of the heat pipe according to the first embodiment and the first wick structure portion and the second wick structure portion of the heat pipe according to the second embodiment are all substantially semi-elliptical in shape, but the shape is not particularly limited and may be, for example, substantially triangular, substantially rectangular, or the like.

In the heat pipes according to each of the above embodiments, in the cross section of the container, the areas in the inner surfaces of the container, which are not in contact with the wick structure, are entirely covered with the sintered metal layer. Alternatively, in the inner surfaces of the container, the sintered metal layer may be provided on a part of the areas which are not in contact with the wick structure. In the heat pipes according to each of the above embodiments, although the sintered metal layer extends from one end to another end of the container, the sintered metal layer may be provided in a partial area in the longitudinal direction instead. In particular, since the working fluid in the liquid phase accumulates in the direction of gravity, the wick structure and the sintered metal layer just need to be provided in a portion where the working fluid in the liquid phase tends to accumulate, that is, a portion on the lower side in the direction of gravity. In the heat pipes according to each of the above embodiments, the top of the curved portion of the wick structure is pressure-welded, but it may not be pressure-welded.

In the heat pipes according to the first and second embodiments, the distance between one flat inner surface and another flat inner surface is substantially equal throughout the longitudinal direction of the flat container. Alternatively, it may be possible to use a flat container which has a different distance between one flat inner surface and another flat inner surface in part of the longitudinal direction.

EXAMPLES

Next, examples of the present disclosure will be described, but these examples are not intended to limit the present disclosure and various changes may be made without departing from the gist of the present disclosure.

In Examples 1 to 10 and Comparative Example 1, as the heat pipe, a heat pipe according to the second embodiment shown in FIG. 2 was used. However, in Comparative Example 1, the heat pipe was not provided with the sintered metal layer. In each of Examples 1 to 10 and Comparative Example 1, a tubular material which was 200 mm in length×10 mm in an outer diameter with a circular cross section and flattened to 1.3 mm was used as the container. Water was used as the working fluid to be sealed in the container. Example 2 and Example 6 are heat pipes which are different in respect of the material of the metal sinter layer. Example 1 and Example 5 are heat pipes which are different in respect of the material of the sintered metal layer, and Example 1 and Example 3 are heat pipes which are different in respect of the maximum width in the cross section of the wick structure. The heat pipes were installed so that the longitudinal direction was oriented vertically, and, after performing heat cycle tests of −20° C.×23 minutes→65° C.×23 minutes, the proportion of the heat pipes having no visible deformation in the container shape was measured as a heat cycle OK ratio (%).

Thermal characteristic evaluation was performed as follows.

As the heat generating device, a heat generating device of 10 mm×20 mm and 60 W was used. This heat generating device was brought into contact with the another end of a container (heat pipe) having the same structure as those used in Examples 1 to 10 and Comparative Example 1, a thermocouple was installed at a point of 15 mm from the one end of the container (heat pipe), and ΔT was measured to make evaluation in four levels below.

A: ΔT was no less than 0° C. and no more than 5° C.

B: ΔT was more than 5° C. and no more than 8° C.

C: ΔT was more than 8° C. and no more than 10° C.

D: ΔT was more than 10° C.

Specific test conditions and test results of Examples and Comparative Examples are shown in Table 1 below.

TABLE 1

| | Container thickness (mm) | Sintered metal layer thickness/Container thickness | Ratio (cross sectional area of contact areas of wick structure being in contact with flat container and corresponding to sintered metal layer thickness + cross-sectional area of sintered metal layer)/(cross-sectional area of wick structure + cross-sectional area of sintered metal layer) | Heat cycle OK ratio | | | | Thermal characteristic Thermal resistance (° C./W) |
|---|---|---|---|---|---|---|---|---|
| | | | | 50 cycles | 100 cycles | 150 cycles | 200 cycles | |
| Example 1 | 0.25 | 40% | 49% | 33% | 33% | 10% | 0% | D |
| Example 2 | 0.25 | 60% | 73% | 100% | 100% | 70% | 50% | B |
| Example 3 | 0.25 | 40% | 49% | 25% | 0% | 0% | 0% | D |
| Example 4 | 0.25 | 40% | 64% | 67% | 33% | 10% | 0% | B |
| Example 5 | 0.25 | 40% | 49% | 50% | 50% | 20% | 0% | D |
| Example 6 | 0.25 | 60% | 73% | 86% | 86% | 75% | 50% | B |
| Example 7 | 0.25 | 40% | 61% | 50% | 17% | 0% | 0% | B |
| Example 8 | 0.25 | 80% | 78% | 100% | 90% | 80% | 60% | B |
| Example 9 | 0.25 | 100% | 86% | 100% | 90% | 90% | 60% | C |
| Example 10 | 0.25 | 120% | 92% | 100% | 90% | 95% | 60% | D |
| Comparative Example 1 | 0.25 | 0% | 0% | 0% | 0% | 0% | 0% | A |

As can be seen from Table 1, in the heat pipes of Examples 1 to 10 provided with the sintered metal layer, deformation of the container shape was reliably prevented even when the number of heat cycles was 50 in cold environment, and a good heat cycle OK ratio was obtained. In Examples 2 and 6 and 8 to 10 in which the ratio of the sintered metal layer thickness/the container thickness was between 60% and 120% and the ratio of (the cross sectional area of contact areas of the wick structure (the areas indicated with "a" in FIG. 2) being in contact with the flat container and corresponding to thickness of the sintered metal layer+the cross sectional area of the sintered metal layer)/(the cross-sectional area of the wick structure+the cross sectional area of the sintered metal layer) was between 73% and 92%, deformation of the container shape was reliably prevented even when the number of heat cycles was 100, and a better heat cycle OK ratio was obtained. Further, in Examples 8 to 10 in which the ratio of the sintered metal layer thickness/the container thickness was between 80% and 120% and the ratio of (the cross-sectional area of contact areas of the wick structure in contact with the flat container and corresponding to thickness of the sintered metal layer+ the cross sectional area of the sintered metal layer)/(the cross-sectional area of the wick structure+the cross-sectional area of the sintered metal layer) was between 78% and 92%, deformation of the container shape was reliably prevented even when the number of heat cycles was 200, and a particularly excellent heat cycle OK ratio was obtained.

In addition, as can be seen from Table 1, the heat pipes of Examples 1 to 10, which were provided with the sintered metal layer, exhibited excellent heat transfer characteristics with ΔT of more than 5° C. In particular, in Examples 1, 3 and 5 in which the ratio of the sintered metal layer thickness/ the container thickness was 40% and the ratio of (the cross-sectional area of contact areas of the wick structure (the areas indicated with "a" in FIG. 2) being in contact with the flat container and corresponding to thickness of the sintered metal layer+the cross-sectional area of the sintered metal layer)/(the cross-sectional area of the wick structure+ the cross-sectional area of the sintered metal layer) was 49%, and in Example 10 in which the ratio of the sintered metal layer thickness/the container thickness was 120% and the ratio of (the cross sectional area of contact areas of the wick structure (the areas indicated with "a" in FIG. 2) being in contact with the flat container and corresponding to thickness of the sintered metal layer+the cross-sectional area of the sintered metal layer)/(the cross-sectional area of the wick structure+the cross-sectional area of the sintered metal layer) was 92%, ΔT was more than 10° C. and better heat transfer characteristics were exhibited.

On the other hand, in the heat pipe of Comparative Example 1 in which the sintered metal layer was not provided, the heat cycle OK ratio was 0% when the number of heat cycles was 50, resulting in failing to prevent deformation of the container shape in cold environment.

Furthermore, in Comparative Example 1, ΔT was no less than 0° C. and no more than 5° C., and superior heat transfer characteristics were not obtained compared to Examples 1 to 10.

Even if a heat pipe of the present disclosure is installed so that the longitudinal direction of the container is substantially parallel to the direction of gravity in cold environment, since freezing of the working fluid is prevented, it is possible to prevent deformation of the thin container and exhibit excellent heat transfer characteristics, and therefore the heat pipe has high utility value, for example, in the field of use in cold regions.

What is claimed is:

1. A heat pipe comprising:
   a container having a tubular shape with both ends sealed;
   a wick structure stored in the container; and
   a working fluid sealed in the container, wherein
   in at least one of cross sections perpendicular to a longitudinal direction of the container, the wick structure is in contact with an inner surface of the container at two points, but both side surfaces of the wick structure are not in contact with any inner surface of the container,
   a sintered metal layer is formed on the container inner surface being not in contact with the wick structure,
   a value of (thickness of the sintered metal layer)/(thickness of the container) is between 100% and 120%, and
   a value of (cross sectional area of contact areas of the wick structure perpendicular to the longitudinal direction of the container being in contact with the container which has a thickness corresponding to the thickness of the sintered metal layer+cross sectional area of the sintered metal layer perpendicular to the longitudinal direction of the container)/(cross sectional area of the wick structure perpendicular to the longitudinal direction of the container+cross sectional area of the sintered metal layer perpendicular to the longitudinal direction of the container) is between 86% and 92%, and
   the wick structure is integrally formed with the sintered metal layer.

2. The heat pipe according to claim 1, wherein at least a part of the cross sections perpendicular to the longitudinal direction of the container is flattened.

3. The heat pipe according to claim 2, wherein in the cross section which is flattened at least in part, the wick structure has a flat bottom side portion and a protruding upper side portion in a protruding shape, the protruding upper side portion is in contact with one of inner surfaces facing each other, and the bottom side portion is in contact with another of the inner surfaces.

4. The heat pipe according to claim 1, wherein the wick structure is a sintered metal body.

5. The heat pipe according to claim 1, wherein
   a top of a curved portion of the wick structure is in a state of being compressed and squashed.

6. A heat pipe comprising:
   a flat container having a tubular shape with both ends sealed, and a pair of inner surfaces facing each other in a vertical direction in a cross section perpendicular to a longitudinal direction;
   a wick structure stored in the flat container; and
   a working fluid sealed in the flat container, wherein
   in at least one of cross sections perpendicular to the longitudinal direction of the flat container, the wick structure is in contact with both of the pair of inner surfaces of the flat container, but both side surfaces of the wick structure are not in contact with any inner surface of the flat container,
   a sintered metal layer is formed on the flat container inner surface being not in contact with the wick structure,
   a value of (thickness of the sintered metal layer)/(thickness of the container) is between 100% and 120%, and
   a value of (cross sectional area of contact areas of the wick structure perpendicular to the longitudinal direction of the container being in contact with the container which has a thickness corresponding to the thickness of the sintered metal layer+cross sectional area of the sintered metal layer perpendicular to the longitudinal direction of the container)/(cross sectional area of the wick structure perpendicular to the longitudinal direction of the container+cross sectional area of the sintered metal layer perpendicular to the longitudinal direction of the container) is between 86% and 92%, and
   the wick structure is integrally formed with the sintered metal layer.

7. The heat pipe according to claim 6, wherein in at least the one cross section, a cross section of the wick structure has a flat bottom side portion and a protruding upper side portion in a protruding shape, the protruding upper side portion is in contact with one of the pair of inner surfaces facing each other, and the bottom side portion is in contact with another of the inner surfaces.

8. The heat pipe according to claim 6, wherein
   a top of a curved portion of the wick structure is in a state of being compressed and squashed.

9. A heat pipe comprising:
   a container having a tubular shape with both ends sealed;
   a wick structure stored in the container; and
   a working fluid sealed in the container, wherein
   the wick structure is composed of a first wick structure portion and a second wick structure portion disposed in a vertical direction in at least one of cross sections perpendicular to a longitudinal direction of the container,
   the first wick structure portion is in contact with an inner surface of the container at one point but both side surfaces of the first wick structure portion are not in contact with any inner surface of the container, the second wick structure portion is in contact with the inner surface of the container at another point but both side surfaces of the second wick structure portion are not in contact with any inner surface of the container, a sintered metal layer is formed on the container inner surface being not in contact with the wick structure, a value of (thickness of the sintered metal layer)/(thickness of the container) is between 100% and 120%, and a value of (cross sectional area of contact areas of the wick structure perpendicular to the longitudinal direction of the container being in contact with the container which has a thickness corresponding to the thickness of the sintered metal layer+cross sectional area of the sintered metal layer perpendicular to the longitudinal direction of the container)/(cross sectional area of the wick structure perpendicular to the longitudinal direction of the container+cross sectional area of the sintered metal layer perpendicular to the longitudinal direction of the container) is between 86% and 92%, and the wick structure is integrally formed with the sintered metal layer.

10. The heat pipe according to claim 9, wherein the first wick structure portion is in contact with the second wick structure portion.

11. The heat pipe according to claim 9, wherein at least a part of the cross sections perpendicular to the longitudinal direction of the container is flattened.

12. The heat pipe according to claim 11, wherein in the cross section which is flattened at least in part, the first wick structure portion has a protruding bottom side portion in a protruding shape and an upper side portion, the second wick structure portion has a flat bottom side portion and a protruding upper side portion in a protruding shape, the protruding bottom side portion of the first wick structure portion is in contact with the protruding upper side portion of the second wick structure portion, the upper side portion of the first wick structure portion is in contact with one of inner surfaces facing each other, and the flat bottom side portion of the second wick structure portion is in contact with another of the inner surfaces.

13. The heat pipe according to claim 9, wherein the wick structure is a sintered metal body.

14. The heat pipe according to claim 9, wherein a bottom of a first curved portion of the first wick structure portion and a top of a second curved portion of the second wick structure portion are in a state of being compressed and squashed.

15. A heat pipe comprising:

a flat container having a tubular shape with both ends sealed, and a pair of inner surfaces facing each other in a vertical direction in a cross section perpendicular to a longitudinal direction;

a wick structure stored in the flat container; and a working fluid sealed in the flat container, wherein the wick structure is composed of a first wick structure portion and a second wick structure portion disposed in the vertical direction in at least one of cross sections perpendicular to the longitudinal direction of the flat container, the first wick structure portion is in contact with one of the pair of inner surfaces of the flat container and with the second wick structure portion but both side surfaces of the first wick structure portion are not in contact with any inner surface of the flat container, the second wick structure portion is in contact with another inner surface of the pair of inner surfaces of the flat container but both side surfaces of the second wick structure portion are not in contact with any inner surface of the flat container, a sintered metal layer is formed on the flat container inner surface being not in contact with the wick structure, a value of (thickness of the sintered metal layer)/(thickness of the container) is between 100% and 120%, and a value of (cross sectional area of contact areas of the wick structure perpendicular to the longitudinal direction of the container being in contact with the container which has a thickness corresponding to the thickness of the sintered metal layer+cross sectional area of the sintered metal layer perpendicular to the longitudinal direction of the container)/(cross sectional area of the wick structure perpendicular to the longitudinal direction of the container+cross sectional area of the sintered metal layer perpendicular to the longitudinal direction of the container) is between 86% and 92%, and the wick structure is integrally formed with the sintered metal layer.

16. The heat pipe according to claim 15, wherein, in at least the one cross section, a cross section of the first wick structure portion has a protruding bottom side portion in a protruding shape and a flat upper side portion, a cross section of the second wick structure portion has a flat bottom side portion and a protruding upper side portion in a protruding shape, the protruding bottom side portion of the first wick structure portion is in contact with the protruding upper side portion of the second wick structure portion, the flat upper side portion of the first wick structure portion is in contact with the one inner surface, and the flat bottom side portion of the second wick structure portion is in contact with the another inner surface.

17. The heat pipe according to claim 15, wherein a bottom of a first curved portion of the first wick structure portion and a top of a second curved portion of the second wick structure portion are in a state of being compressed and squashed.

* * * * *